United States Patent

[11] 3,614,546

[72] Inventor Jack Avins
Princeton, N.J.

[21] Appl. No. 1,246
[22] Filed Jan. 7, 1970
[45] Patented Oct. 19, 1971
[73] Assignee RCA Corporation

[54] SHIELDED SEMICONDUCTOR DEVICE
7 Claims, 5 Drawing Figs.

[52] U.S. Cl. .......... 317/234 R, 317/234 E, 317/234 G, 29/577, 313/313
[51] Int. Cl. .......... H01l 3/00, H01l 5/00
[50] Field of Search .......... 317/234, 235, 3, 3.1, 4, 4.1, 18, 39, 58, 101; 313/239, 240, 241, 313; 29/577

[56] References Cited

UNITED STATES PATENTS

| | | | |
|---|---|---|---|
| 3,274,458 | 9/1968 | Boyer et al. | 317/234 |
| 3,387,190 | 6/1968 | Winkler | 317/234 |
| 3,436,810 | 4/1969 | Kauffman | 317/234 X |
| 3,465,210 | 9/1969 | Bertram et al. | 317/234 |
| 3,489,953 | 1/1970 | Thomas | 317/235 X |
| 3,509,430 | 4/1970 | Mroz | 317/234 |
| 3,518,494 | 6/1970 | James | 317/235 X |
| 3,520,054 | 7/1970 | Densack et al. | 317/234 X |

*Primary Examiner*—John W. Huckert
*Assistant Examiner*—Andrew J. James
*Attorney*—Glenn H. Bruestle

ABSTRACT: A dual-in-line type device comprises an elongated, rectangular envelope. Emerging from each of two opposed, elongated sides of the envelope is a row of leads. Disposed along the other elongated envelope sides are a pair of elongated shield members having end portions disposed along the end sides of the envelope. The shield end portions are secured to conductive members extending outwardly through the end sides. Within the envelope, a semiconductor pellet is mounted on a substrate connected to the conductive members.

PATENTED OCT 19 1971

3,614,546

INVENTOR.
JACK AVINS
BY M. Y. Epstein
Attorney

SHIELDED SEMICONDUCTOR DEVICE

BACKGROUND OF THE INVENTION

This invention relates to semiconductor devices, and particularly to semiconductor devices of the type known as "dual-in-line" devices.

Dual-in-line semiconductor devices comprise an elongated envelope having one row of leads extending outwardly from each of two opposite elongated sides of the envelope. Within the envelope, the ends of the leads are connected to various elements of a semiconductor integrated circuit. Advantages of such devices are that they are quite small, containing numerous electrical elements or circuits in a package having dimensions, for example, of 250×750×150 mils, and the devices are relatively inexpensive.

A problem associated with such devices, however, is that of providing electrostatic shielding therefor. That is, because of the small size of the device and close spacing of the various parts thereof, it is difficult to incorporate suitable shielding without causing short circuiting of the various parts of the device and without significantly increasing the cost thereof.

DESCRIPTION OF PREFERRED EMBODIMENTS OF THE INVENTION

Figure 1:
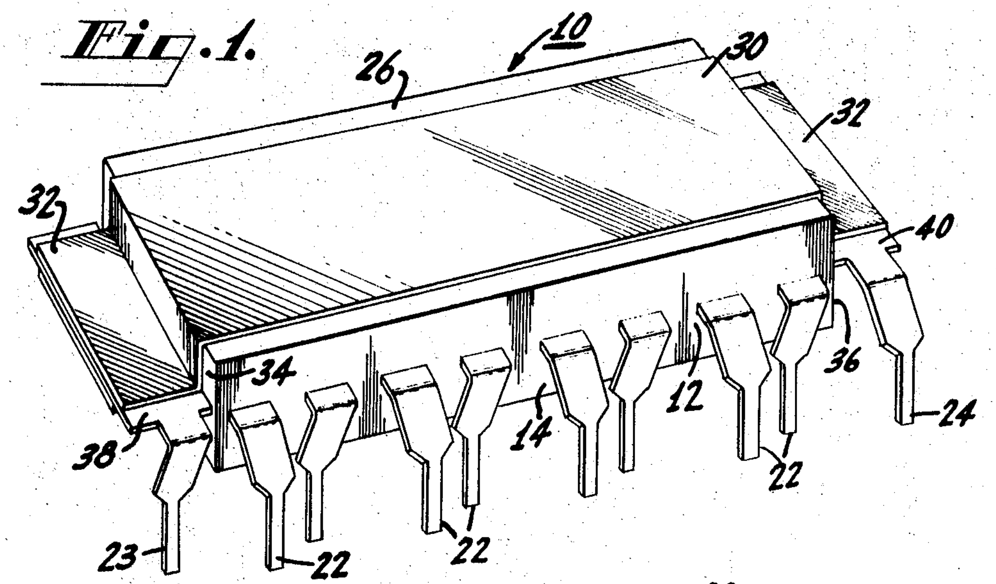
FIG. 1 is a view in perspective of a semiconductor device in accordance with the instant invention.
Figure 2:
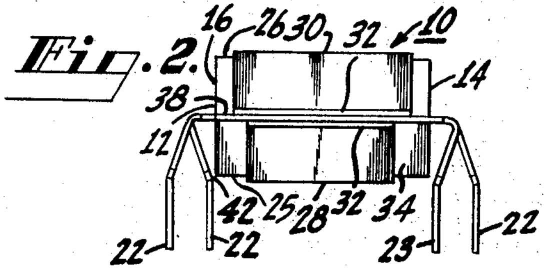
FIG. 2 is an end view, looking from the left of FIG. 1, of the device shown in FIG. 1.

With reference to FIGS. 1 and 2, a semiconductor device 10 is shown which comprises an elongated, rectangular envelope 12 of a solid, plasticlike encapsulating material, such as the Dow-Corning Co. 306 silicon molding compound. Embedded within the envelope 12 and extending outwardly therefrom through opposite elongated sides 14 and 16 of the envelope are two rows of leads 22. Further, one row of leads includes two leads 23 and 24 which do not extend outwardly from the envelope sides 14 or 16, but which are integral with conductive members, hereinafter described, extending outwardly from the end sides 34 and 36 of the envelope. As shown, the leads of each row of leads are disposed in two interleaved arrays of leads, all of the free ends of the leads extending in the same general direction, but the leads of one array being disposed inwardly, relative to the envelope, from the leads of the other array of the same row of leads.

Disposed along the other elongated sides 25 and 26 of the envelope are a pair of electrically conductive, e.g., thin metal sheet, shield members 28 and 30. The shield members 28 and 30 include end portions 32 which are disposed downwardly along the end sides 34 and 36 of the envelope 12, and then outwardly therefrom. Extending outwardly through the envelope end sides 34 and 36, and electrically and mechanically joined, as by welding or staking, to the shield member end portions 32, are a pair of flat conductive members 38 and 40. The shield members 28 and 30 are thus electrically joined together at the end portions 32 thereof and form a closed loop about the envelope 12. The securing of the shield members 28 and 30 to the conductive members 38 and 40 also serves to rigidly secure the shield members to the envelope 12. The leads 23 and 24 are integral extensions of the conductive members 38 and 40, respectively.

As described, one lead array of each row of leads is disposed inwardly relative to the envelope 12. In the instant embodiment, the bent portions or shoulders 42 (FIG. 2) of the inwardly disposed leads 22 are disposed rather close to the bottom edges of the envelope, and may even touch the envelope. To prevent shorting of the leads 22 with the bottom shield member 28, this member 28 has a width somewhat less than the width of the envelope 12 so as not to extend too closely to the edges of the envelope. The other shield member 30, being disposed along the side 26 of the envelope opposite to the extending direction of the leads, is wider than the shield member 28.

The shape and dimensions of the leads 22, 23, and 24, it is noted, have become fixed or standardized as a result of prior commercial usage of dual-in-line devices of the type herein described. Thus, the addition of the shield members 28 and 30, in accordance with this invention, is preferably done in a manner not requiring changes in the lead configurations.

Figure 3:
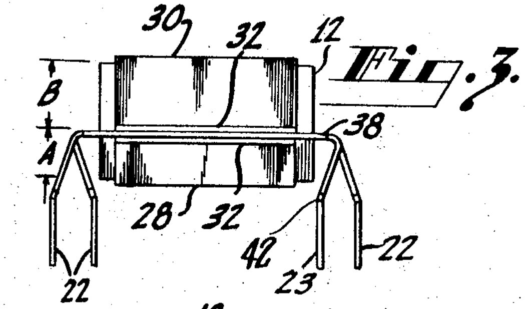
FIG. 3 is an end view of another embodiment of the instant invention.

In another embodiment, shown in FIG. 3, the bottom half A of the envelope 12, as measured from the line of emergence of the rows of leads, is reduced in thickness, in comparison with the upper half B of the envelope, whereby the space between the lead shoulders 42 and the envelope 12 is increased. Thus, the shield member 28, in this embodiment, is not of reduced width.

Figure 4:
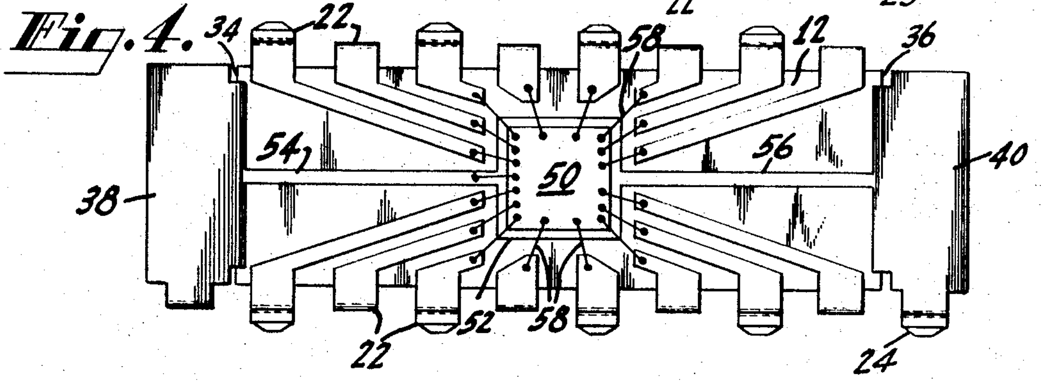
FIG. 4 is a plan view of the device shown in FIGS. 1 and 2 with the upper portion of the envelope removed to show the interior of the device.

Within the envelope 12, as shown in FIG. 4, is a semiconductor pellet 50 including a plurality of electrical elements, not shown. The pellet 50 is mounted on a thin square substrate 52 of metal which is integral with two thin, elongated metal conductors 54 and 56. The conductors 54 and 56 terminate in the flat conductive members 38 and 40, respectively, previously referred to, which extend outwardly through the end sides 34 and 36, respectively, of the envelope. The inner ends of the leads 22, which are embedded in the molded envelope 12, are individually connected to various ones of the electrical elements on the pellet 50 by means of fine wires 58.

In use of the device 10, the leads 23 and 24, integral with the conductive members 38 and 40, are generally connected to ground potential, whereby the shield members 28 and 30 are likewise grounded.

In other embodiments, more fully described hereinafter, the two shield members 38 and 40 are not connected in a closed loop. An advantage of this arrangement arises in instances where the semiconductor pellet 50 includes two or more electrical circuits operating at significantly different signal levels, and wherein it is desirable to prevent cross-coupling between the two circuits. An example of such a semiconductor pellet arrangement is shown in my copending application, Ser. No. 803,544, filed Mar. 3, 1969. One means of preventing such cross-coupling, as described in said copending application, is to provide separate ground connections, via separate leads, for each of the circuits, whereby the signals of each circuit do not interact with each other through a common ground terminal.

Figure 5:
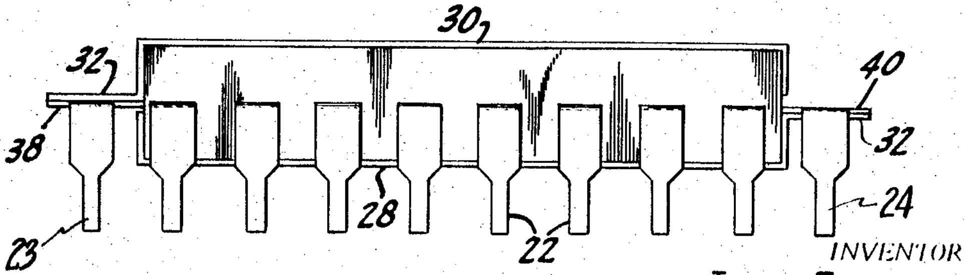
FIG. 5 is a side view of still another embodiment of the invention.

A problem, associated with the need for the use of separate ground connections, is that in some instances, as in the case of complex integrated circuit pellets requiring numerous external connections, the number of terminal leads is limited. Thus, in such cases, it is desirable to use the leads 23 and 24 as ground connections both for the shield members 28 and 30 and for the electrical circuits on the pellet. This reduces the number of leads required, thereby reducing the cost of the device.

Where two separate ground leads are required, however, the shield members 28 and 30 should be arranged so as not to provide a large inductive impedance common to the two circuits, whereby cross-coupling between the circuits can occur. Thus, in the embodiment shown in FIG. 5, only one end portion 32 of each of the shield members 28 and 30 is connected to a different one of the flat conductive members 38 and 40 at opposite ends of the envelope, whereby the leads 23 and 24 are not shorted together by the elongated, hence inductive shield members 28 and 30. While the two leads 23 and 24 are electrically connected at the substrate 52, as shown in FIG. 4, the inductive impedance of the substrate 52 is so small as to give rise to little or no cross-coupling of circuits.

In another embodiment, not illustrated, one end portion 32 of both shield members 28 and 30 are connected together to one of the conductive members 38 or 40 at one end of the device. At the other end of the device, the other end portions of the shield members are electrically isolated from the other of the conductive members. Again, the shield members 28 and 30 do not form a closed loop.

I claim:

1. A semiconductor device comprising:
an elongated envelope having first and second pairs of elongated opposite sides, and a pair of end sides,
two rows of leads, one row emerging from each of the sides of said first pair of sides,
two shield members disposed one each along each of the sides of said second pair of sides, said shield members including end portions disposed along said end sides,
a lead connected to one of said shield members and disposed in one of said rows,
an elongated conductor disposed within said envelope and having an end member thereof projecting outwardly of said envelope through one of said end sides thereof,
a semiconductor pellet mounted on said conductor within said envelope, and
the end portion of one of said shield members at one end of said envelope being electrically connected to said projecting end member.

2. A semiconductor device as in claim 1 wherein said end portions of said shield members are electrically connected at each end of said envelope to form a closed loop of said shield members about said envelope.

3. A semiconductor device as in claim 1 in which
said elongated conductor has two end members projecting outwardly of said envelope through said end sides thereof, and
the end portion of each of said shield members at opposite ends of said envelope is electrically connected to the projecting end member at each of said envelope end sides to form a closed loop of said shield members about said envelope.

4. A semiconductor device as in claim 1 in which
said elongated conductor has two end members projecting outwardly from said envelope through said end sides thereof, and a lead connected to each of said end members, and
one end portion only of each of said shield members is electrically connected to either of said conductor end members, whereby the leads connected to said end members are not electrically connected together via said shield members.

5. A semiconductor device as in claim 1 wherein:
all of said leads extend in the same general direction towards one of said shield members and away from the other of said shield members, and
said one shield member has a width less than the other of said shield members.

6. A semiconductor device as in claim 1 wherein:
all of said leads extend in the same general direction towards one of said shield members and away from the other of said shield members, and
the thickness of said envelope between the line of emergence of said rows of leads from said envelope and said one shield member being less than the thickness of said envelope between said line of emergence and said other shield member.

7. A semiconductor device as in claim 1 in which said lead is integral with said end member of said elongated conductor, and is disposed in said one row at a position beyond said one end side of said envelope.